(12) United States Patent
Shimanouchi

(10) Patent No.: US 10,164,552 B2
(45) Date of Patent: Dec. 25, 2018

(54) POWER GENERATING DEVICE AND SENSOR SYSTEM

(71) Applicant: FUJITSU LIMITED, Kawasaki-shi, Kanagawa (JP)

(72) Inventor: Takeaki Shimanouchi, Akashi (JP)

(73) Assignee: FUJITSU LIMITED, Kawasaki (JP)

( * ) Notice: Subject to any disclaimer, the term of this patent is extended or adjusted under 35 U.S.C. 154(b) by 318 days.

(21) Appl. No.: 15/019,213

(22) Filed: Feb. 9, 2016

(65) Prior Publication Data

US 2016/0156286 A1    Jun. 2, 2016

Related U.S. Application Data

(63) Continuation of application No. PCT/JP2013/072025, filed on Aug. 16, 2013.

(51) Int. Cl.
  *H01L 41/12* (2006.01)
  *H02N 2/18* (2006.01)

(52) U.S. Cl.
  CPC ........... *H02N 2/186* (2013.01); *H01L 41/125* (2013.01)

(58) Field of Classification Search
  CPC ....... H01L 41/12; H01L 41/125; H01L 41/20; B06B 1/08; B06B 1/085; H03H 9/22; H04R 15/00
  USPC .......................................................... 310/26
  See application file for complete search history.

(56) References Cited

U.S. PATENT DOCUMENTS

| 5,014,321 | A | * | 5/1991 | Klein | H04R 15/00 381/111 |
|---|---|---|---|---|---|
| 5,239,514 | A | * | 8/1993 | Winbow | G01V 1/52 367/31 |
| 5,369,625 | A | * | 11/1994 | Gabrielson | H04R 23/00 116/DIG. 19 |
| 2006/0144472 | A1 | | 7/2006 | Ullakko et al. | |
| 2007/0296283 | A1 | | 12/2007 | Tucker et al. | |
| 2009/0167115 | A1 | | 7/2009 | Tucker et al. | |
| 2009/0218914 | A1 | | 9/2009 | Tucker et al. | |
| 2013/0140919 | A1 | * | 6/2013 | Ueno | H01L 41/125 310/26 |

(Continued)

FOREIGN PATENT DOCUMENTS

| JP | 2006-521198 A | 9/2006 |
|---|---|---|
| JP | 2008-072862 A | 3/2008 |

(Continued)

OTHER PUBLICATIONS

International Search Report and Written Opinion of the International Searching Authority (Form PCT/ISA/210, Form PCT/ISA/237), dated Nov. 19, 2013 in connection with PCT/JP2013/072025 (6 pages).

(Continued)

*Primary Examiner* — Thomas Dougherty
(74) *Attorney, Agent, or Firm* — Fujitsu Patent Center

(57) ABSTRACT

A disclosed power generating device includes: a first magnetostrictive bar; a second magnetostrictive bar extending alongside the first magnetostrictive bar; a joint member coupling the first magnetostrictive bar and the second magnetostrictive bars; and a coil group including a first coil wound around the first magnetostrictive bar and a second coil wound around the second magnetostrictive bar, wherein the first coil and the second coil are connected in series.

9 Claims, 21 Drawing Sheets

(56) References Cited

U.S. PATENT DOCUMENTS

| | | | |
|---|---|---|---|
| 2013/0241211 A1* | 9/2013 | Yagi | F03G 1/00 |
| | | | 290/1 E |
| 2014/0311544 A1 | 10/2014 | Kurihara | |

FOREIGN PATENT DOCUMENTS

| | | | | |
|---|---|---|---|---|
| JP | 2009-071960 A | | 4/2009 | |
| JP | 2009-130988 A | | 6/2009 | |
| JP | 2009-542177 A | | 11/2009 | |
| JP | 2012-161238 A | * | 8/2012 | H02N 2/00 |
| JP | 2012-161238 A | | 8/2012 | |
| WO | 20110158473 A1 | | 12/2011 | |
| WO | 20130103009 A1 | | 7/2013 | |

OTHER PUBLICATIONS

JPOA—Office Action dated Oct. 18, 2016 for corresponding to Japanese Patent Application No. 2015-531714, with partial English translation.

* cited by examiner

POWER GENERATING DEVICE AND SENSOR SYSTEM

CROSS-REFERENCE TO RELATED APPLICATION

This application is a continuation application of International Application PCT/JP2013/072025 filed on Aug. 16, 2013 and designated the U.S., the entire contents of which are incorporated herein by reference.

FIELD

The embodiments discussed herein are related to a power generating device and a sensor system.

BACKGROUND

There have been studied a sensor system which includes sensors installed on monitoring targets such as bridges and tunnels so as to monitor these monitoring targets, and which monitors the abnormality of the monitoring targets based on signals wirelessly transmitted from the sensors.

Such a sensor system requires a power supply to drive each sensor. However, when a battery is used as the power supply, there arises such a problem that the sensor cannot be driven after the battery's life ends. Moreover, disposal of such dead batteries leads to environmental damage.

Accordingly, energy harvesting techniques are attracting attentions as the technique to provide power supplies to the sensors without using batteries. The energy harvesting techniques generate electric power from ambient energy such as heat, vibration, and radio waves. The energy harvesting techniques have a merit that it can generate electric power so long as the ambient energies exist.

As a power generating device using such an energy harvesting technique, a power generating device using a magnetostrictive material has been proposed, for example. This power generating device induces electromotive force in a coil wound around a bar made of a magnetostrictive material by using a phenomenon in which the magnetic flux penetrating the bar changes when stress applied to the bar changes.

When installed on a bridge or the like, the power generating device can generate electric power by using vibration of the bridge.

However, the above-described power generating device has room for improvement in terms of efficiency of extracting generated electric power.

Note that techniques related to the present application are disclosed in International Publication Pamphlet No. WO2011/158473, and Japanese Laid-open Patent Publication No. 2008-72862.

SUMMARY

According to one aspect discussed herein, there is provided a power generating device, including: a first magnetostrictive bar; a second magnetostrictive bar extending alongside the first magnetostrictive bar; a joint member coupling the first magnetostrictive bar and the second magnetostrictive bars; and a coil group including a first coil wound around the first magnetostrictive bar and a second coil wound around the second magnetostrictive bar, wherein the first coil and the second coil are connected in series.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Prior to description of embodiments, the studies conducted by the inventor are described.

Figure 1:
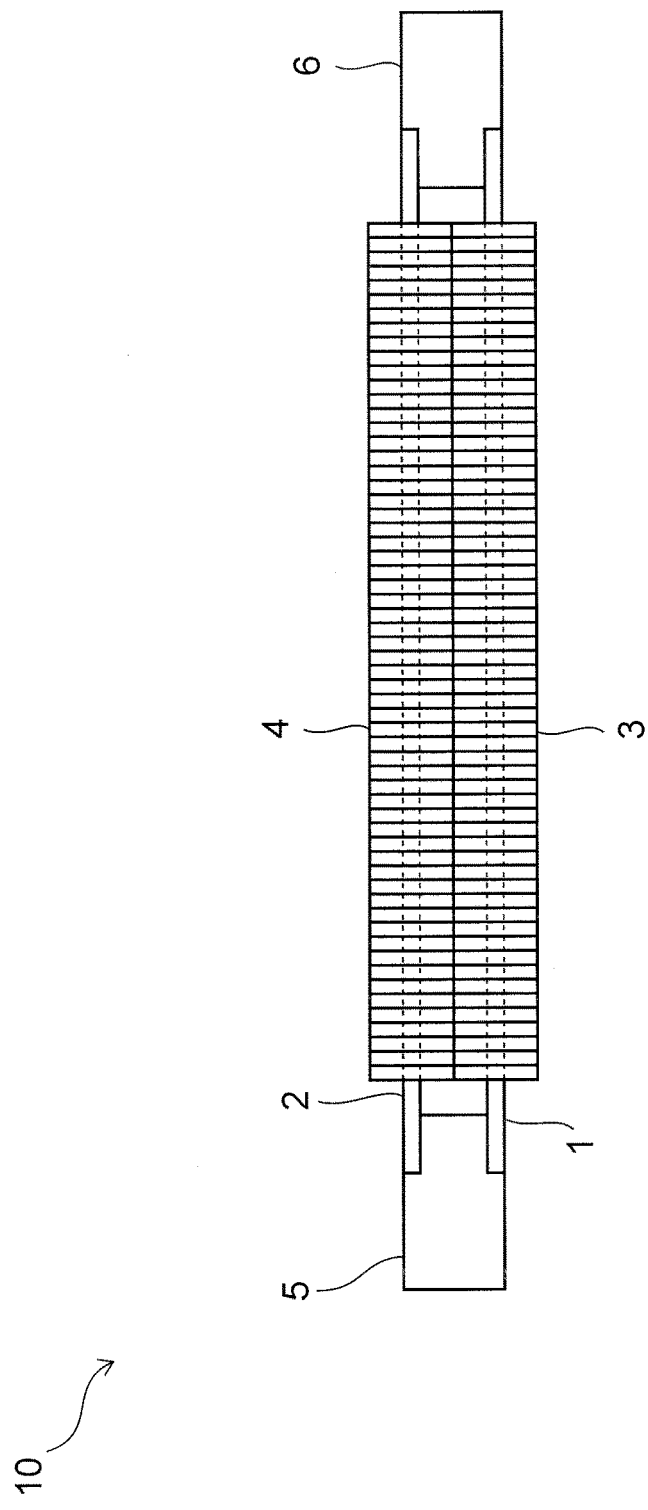
FIG. 1 is a front view of a power generating device used in studies.

FIG. 1 is a front view of a power generating device used in the studies.

The power generating device 10 is configured to generate electric power by applying stress to a magnetostrictive material. The power generating device 10 includes first and second magnetostrictive bars 1 and 2, first and second coils 3 and 4, and first and second joint members 5 and 6.

Each of the magnetostrictive bars 1 and 2 is made of a magnetostrictive material such as iron gallium alloy, for example, and the length thereof is about 10 mm. Note that iron gallium alloy is sometimes called Galfenol. The cross-section of each of the magnetostrictive bars 1 and 2 has a rectangular profile, the long and short sides of the rectangular are about 1 mm and about 0.5 mm, respectively.

The magnetostrictive bars 1 and 2 extend alongside each other. Ends of the magnetostrictive bars 1 and 2 on one side are coupled to each other with the first joint member 5, while ends of the magnetostrictive bars 1 and 2 on the other side are coupled to each other with the second joint member 6. The joint members 5 and 6 are made of a magnetic material including iron, and are mechanically and magnetically connected to the magnetostrictive bars 1 and 2.

The first coil 3 is wound around the outer circumference of the first magnetostrictive bar 1, and the second coil 4 is wound around the outer circumference of the second magnetostrictive bar 2. These coils 3 and 4 are copper wire, for example. Each of the coils 3 and 4 has about 300 turns.

Figure 2:
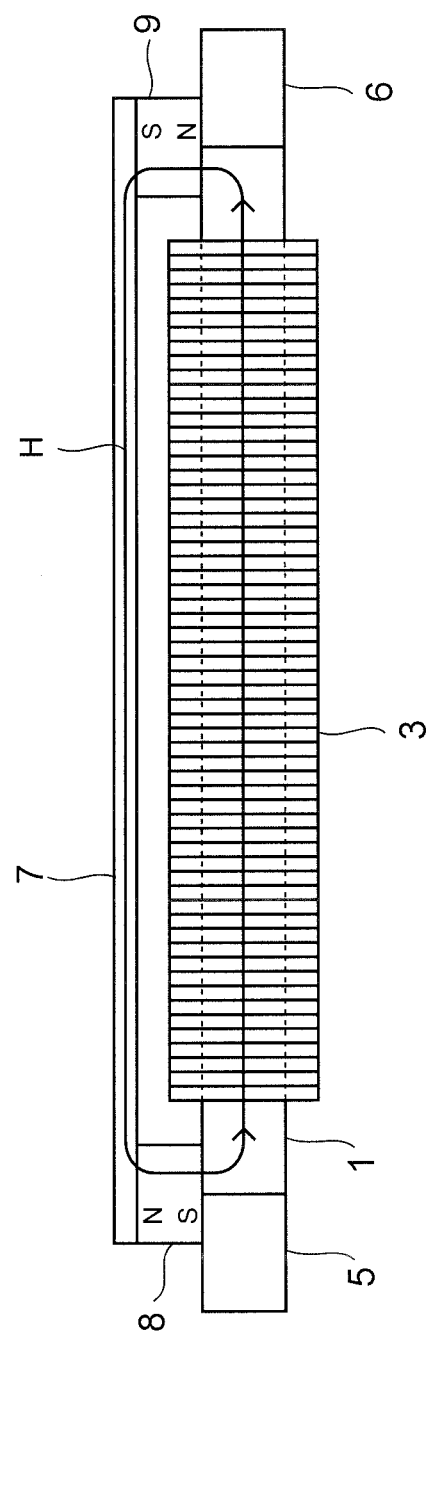
FIG. 2 is a side view of the power generating device used in the studies.

FIG. 2 is a side view of the power generating device 10.

The same components in FIG. 2 as those described in FIG. 1 are given the same reference numerals as those described in FIG. 1, and the description thereof is omitted.

As illustrated in FIG. 2, first and second permanent magnets 8 and 9 are magnetically and mechanically connected to both ends of the first magnetostrictive bar 1, respectively. Note that the permanent magnets 8 and 9 are also magnetically and mechanically connected to both ends of the second magnetostrictive bar 2 (see FIG. 1) as well as the first magnetostrictive bar 1.

A yoke 7 is provided beside the magnetostrictive bars 1 and 2, in such a way that the yoke 7 is extending alongside the magnetostrictive bars 1 and 2. The yoke 7 is magnetically and mechanically connected to the permanent magnets 8 and 9. The material of the yoke 7, which is not particularly limited, is a magnetic material including iron in this example.

In the power generating device 10, the bars 1 and 2 and yoke 7 form a magnetic path. The magnetic field H generated by the permanent magnets 8 and 9 circulates along this magnetic path.

Because of the existence of the magnetic field H, the easy axis of magnetization of the magnetostrictive material of the magnetostrictive bars 1 and 2 is directed along the axial direction of the magnetostrictive bars 1 and 2. This is also the case for the embodiments described later.

Figure 3:
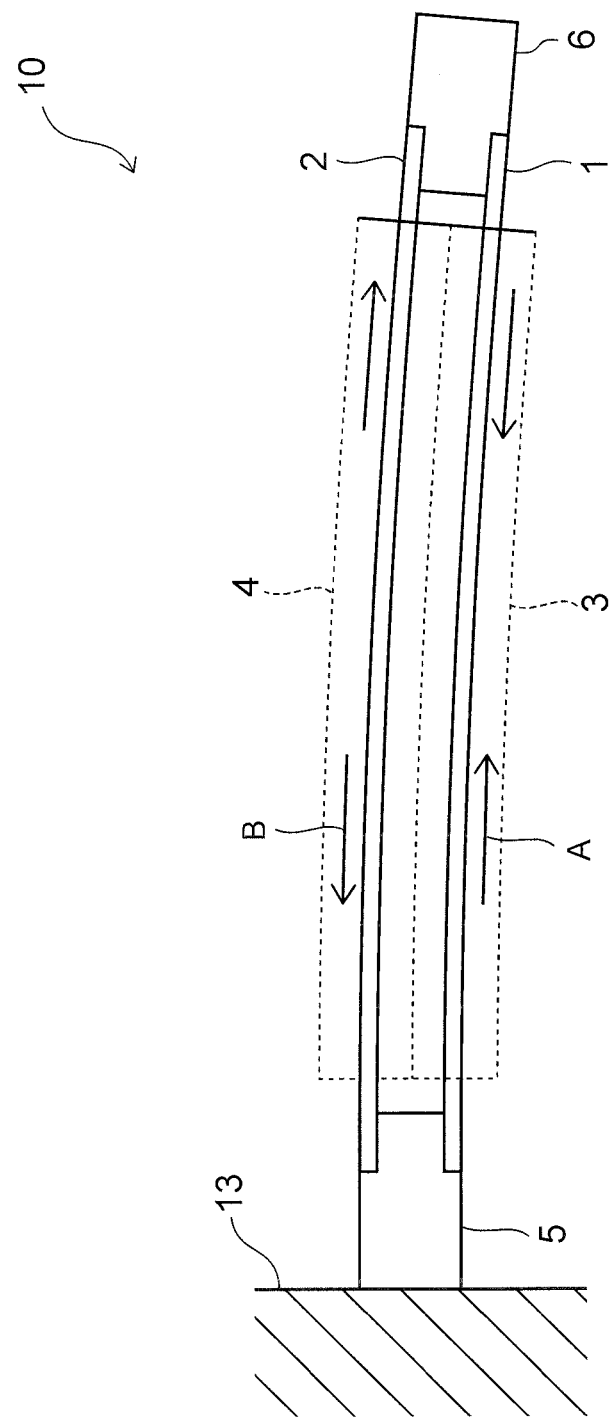
FIG. 3 is a schematic diagram for explaining the principle of power generation by the power generating device used in the studies.

FIG. 3 is a schematic view for explaining the principle of power generation by the power generating device 10. In FIG. 3, the same components as those described in FIGS. 1 and 2 are given the same reference numerals as those in FIGS. 1 and 2, and the description thereof is omitted below.

As illustrated in FIG. 3, in actual use, the power generating device 10 is fixed to a vibrating body 13, such as a bridge or a motor. In this example, the first joint member 5 is fixed to the vibrating body 13, for example.

Vibration of the vibrating body 13 causes vibration of the first and second magnetostrictive bars 1 and 2, which causes periodic expansion and contraction of these magnetostrictive bars 1 and 2. In this example, the both ends of the magnetostrictive bar 1 and 2 are coupled to each other with the joint members 5 and 6 as described above. Accordingly, the magnetostrictive bars 1 and 2 do not vibrate independently. Rather, the magnetostrictive bars 1 and 2 expand and contract in directions A and B opposite to each other.

With such expanding and contracting motion, an inverse magnetostrictive effect which changes the magnetization of the magnetostrictive material is induced in each of the magnetostrictive bars 1 and 2. Therefore, the magnetic flux penetrating each of the coils 3 and 4 fluctuates with time, so that the induced electromotive force can be extracted from the coils 3 and 4.

This induced electromotive force may be extracted from the first and second coils 3 and 4 individually. Alternatively, the induced electromotive force may be extracted from the first and second coils 3 and 4 which are connected in parallel.

It is therefore considered that the energy harvesting technique can be implemented by converting the vibration of the vibrating body 13 into electric power with the power generating device 10 in this manner.

However, the power generating device 10 has a problem that it is difficult to make impedance matching with another circuit. The problem is described below.

Figure 4:
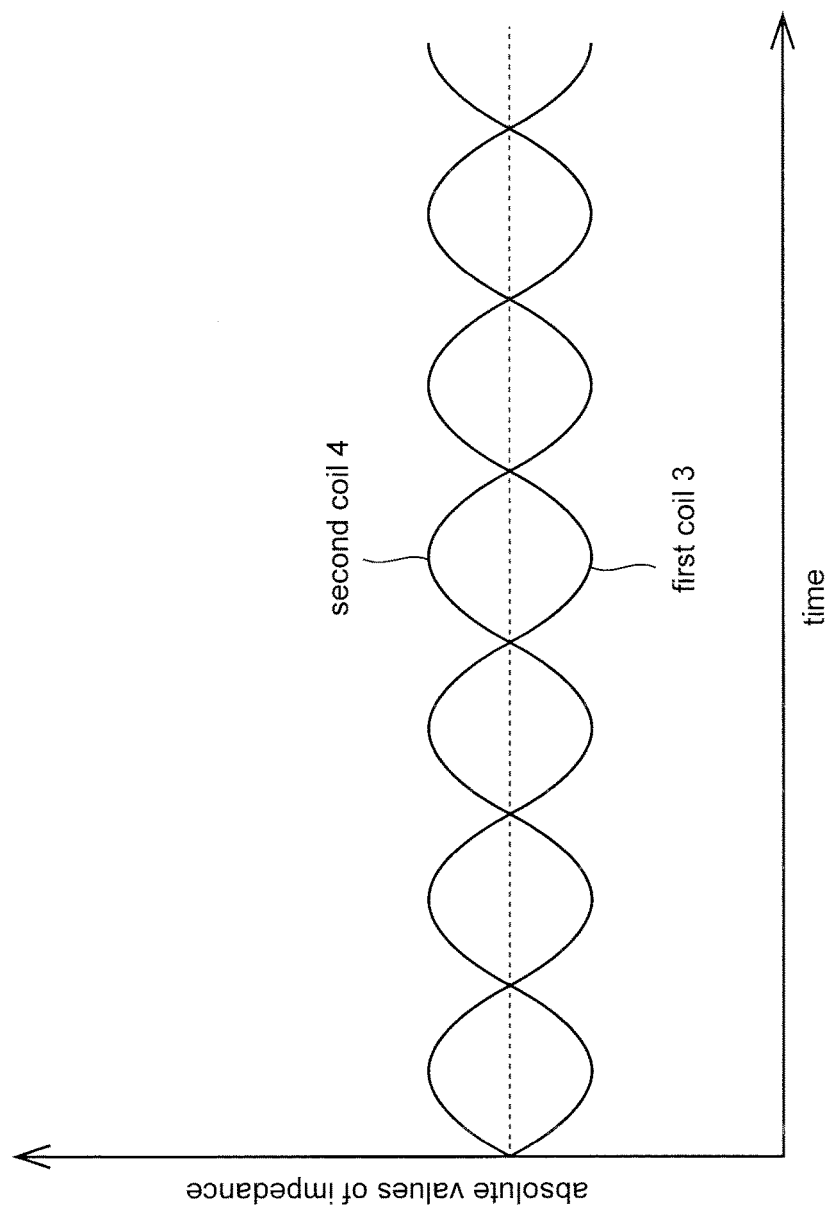
FIG. 4 is a graph schematically illustrating temporal changes in impedance of coils of the power generating device used in the studies.

FIG. 4 is a graph schematically illustrating temporal changes in impedance of the first and second coils 3 and 4. The horizontal axis of the graph represents time, while the vertical axis represents absolute values of impedance.

When the magnetostrictive bars 1 and 2 expand and contract along with the vibration of the vibrating body 13 as described above, the magnetization of the magnetostrictive bars 1 and 2 changes, and hence the magnetic permeability of the magnetostrictive bars 1 and 2 changes with time. Accordingly, impedances of the first and second coils 3 and 4, which are respectively wound around the magnetostrictive bars 1 and 2, change at the same cycle as that of the vibration of the magnetostrictive bars 1 and 2.

In this example, the directions A and B of the contraction of the first and second magnetostrictive bars 1 and 2 are opposite to each other. Therefore, the temporal changes in impedance of the first and second coils 3 and 4 have opposite phases to each other.

Because of the changes in impedance described above, when the power generating device 10 is connected to another circuit, the impedance of the power generating device 10 seen from the circuit changes with time, so that impedance matching between the circuit and the power generating device 10 cannot be achieved. Accordingly, electric power from the power generating device 10 is not efficiently transmitted to another circuit, which results in energy loss.

Figure 5:
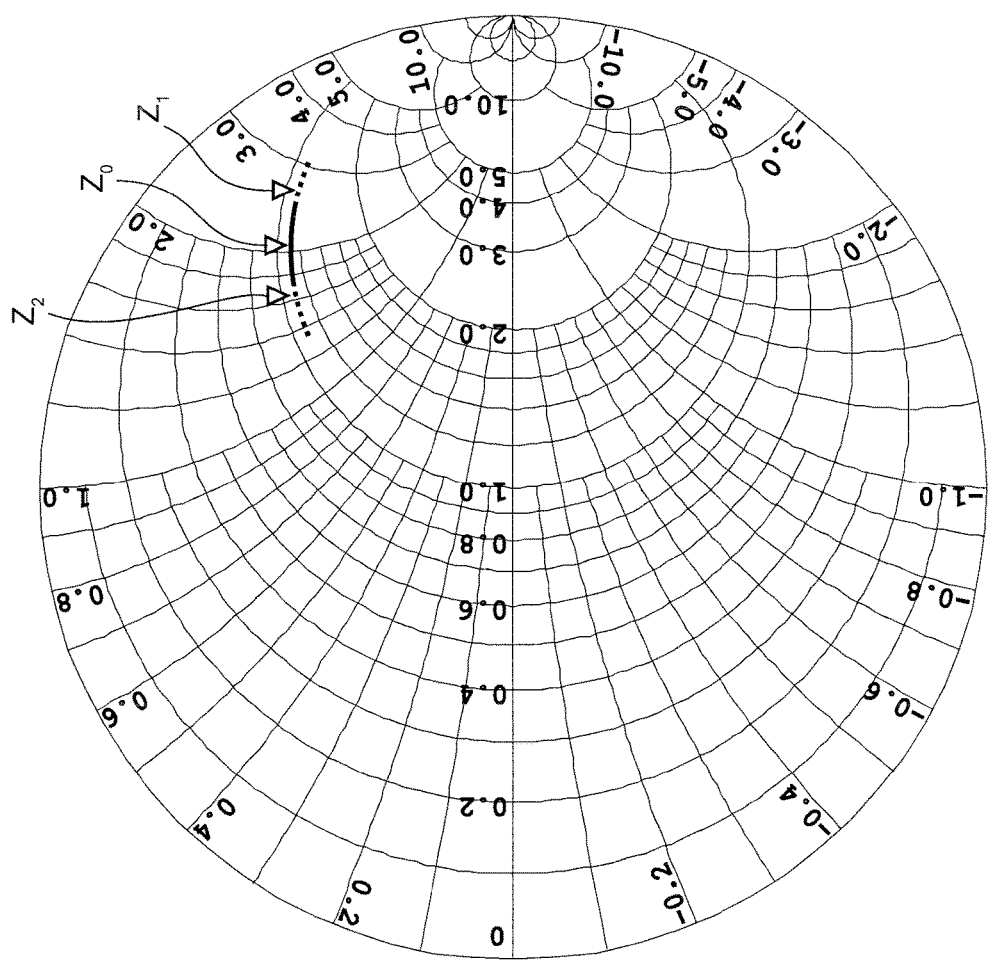
FIG. 5 is a Smith chart illustrating impedance of the coils of the power generating device used in the studies.

FIG. 5 is a Smith chart illustrating the impedances of the first and second coils 3 and 4 described above.

In this example, it is assumed that a downward force of 1.2 kgf is applied to the second joint member 6, and the frequency of the electromotive force induced by each coil 3 or 4 is assumed to range from 80 to 120 Hz.

As illustrated in FIG. 5, when neither the first magnetostrictive bar 1 nor second magnetostrictive bar 2 expands or contracts, an impedance $Z_0$ of each of the first and second coils 3 and 4 is located in the upper half-plane of the Smith chart.

When the magnetostrictive bars 1 and 2 expand and contract, impedance $Z_1$ of the first coil 3 and impedance $Z_2$ of the second coil 4 move on a constant resistance circle in directions opposite to each other. This is because the magnetostrictive bars 1 and 2 expand and contract in directions opposite to each other as described above, and the magnetization of one of the magnetostrictive bars 1 and 2 increases while the magnetization of the other one decreases.

Note that the values that the impedances $Z_0$, $Z_1$, and $Z_2$ can take draw an arc on the constant-resistance circle. This is because the impedances have different values depending on the frequency of the induced electromotive force induced in the coils 3 and 4.

Even when the magnetostrictive bars 1 and 2 expand and contract in this manner, the impedance $Z_1$ and impedance $Z_2$ are located in the upper half-plane of the Smith chart and are not located on the real axis.

Impedance matching between a power supply and a circuit is often performed at 50Ω on the real axis. Accordingly, when the impedances $Z_1$ and $Z_2$ are located in the upper half-plane in this manner, it becomes more difficult to achieve impedance matching between the power generating device 1 and another circuit.

Hereinafter, a description is given of the embodiments in which impedance matching with another circuit can be easily achieved and electric power can be efficiently extracted through the another circuit.

First Embodiment

Figure 6:
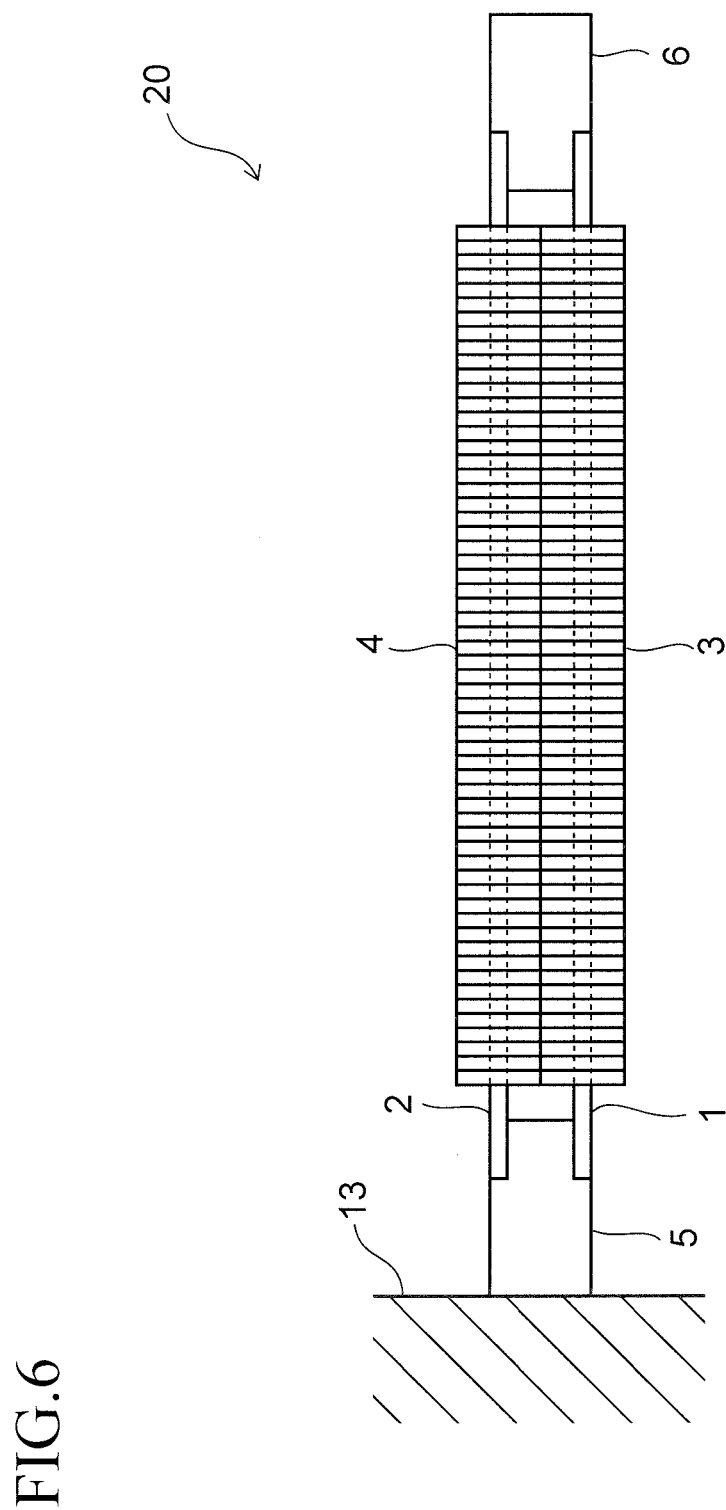
FIG. 6 is a front view of a power generating device according to a first embodiment.

FIG. 6 is a front view of a power generating device according to a first embodiment. In FIG. 6, the same components as those described in FIG. 1 are given the same reference numerals as those in FIG. 1, and the description thereof is omitted.

As illustrated in FIG. 6, a power generating device 20 is used by fixing it to a vibrating body 13 such as a bridge, and includes first and second magnetostrictive bars 1 and 2.

The both ends of the magnetostrictive bars 1 and 2 are coupled to each other with joint members 5 and 6. Also, there is provided first and second coils 3 and 4 around the magnetostrictive bars 1 and 2 respectively. Each of the first and second coils 3 and 4 has about 300 turns.

As described with reference to FIG. 1, the magnetostrictive bars 1 and 2 may be made of a magnetostrictive material such as iron gallium alloy, and the joint members 5 and 6 may be made of a magnetic materials including iron.

The magnetostrictive bars 1 and 2 have a length of about 10 mm, and the cross-section thereof has a rectangular profile. The long and short sides of the rectangular are about 1 mm and about 0.5 mm, respectively.

Figure 7:
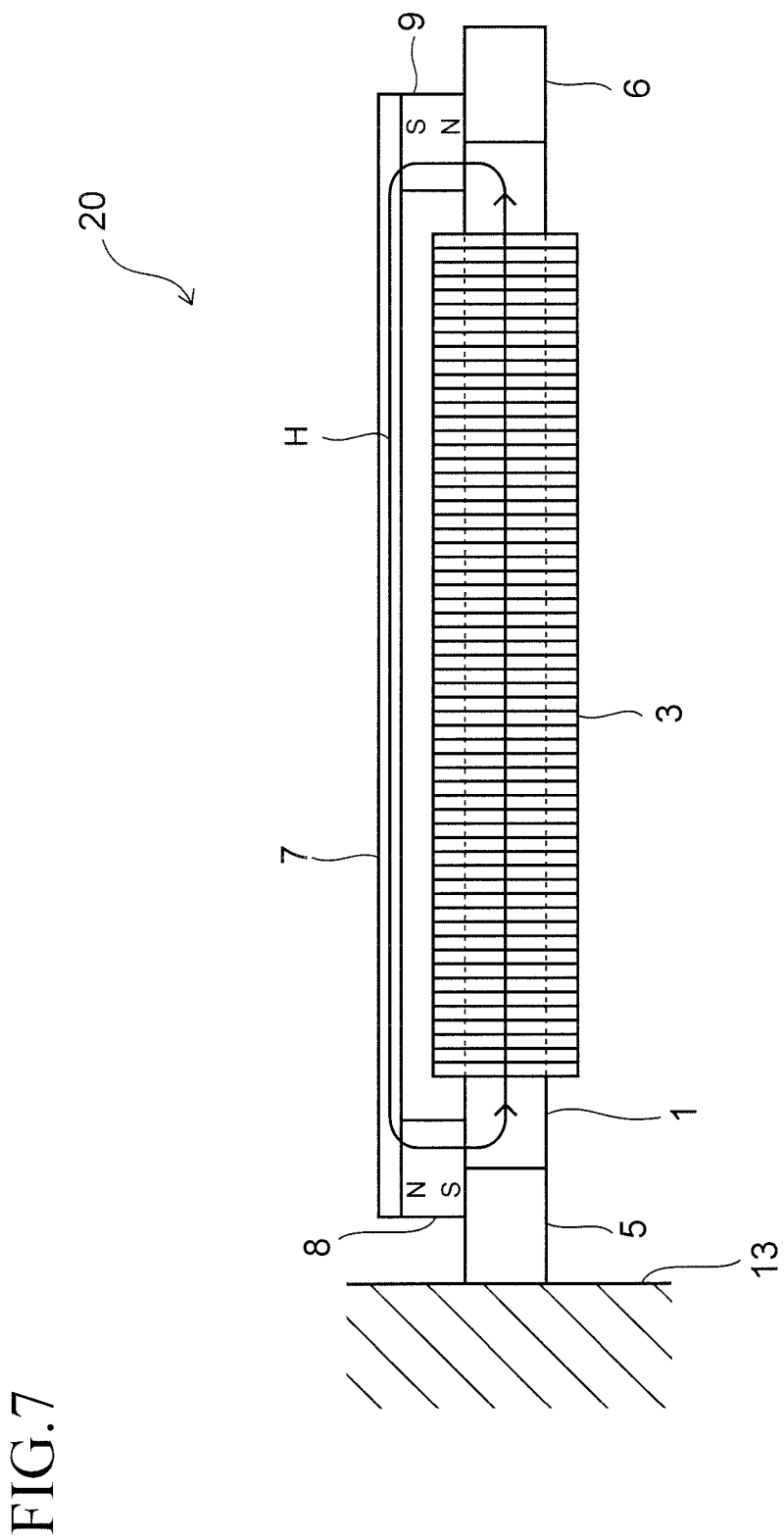
FIG. 7 is a side view of the power generating device according to the first embodiment.

FIG. 7 is a side view of the power generating device 20.

As illustrated in FIG. 7, first and second permanent magnets 8 and 9 are connected to both ends of the magnetostrictive bars 1 and 2, respectively. The permanent magnets 8 and 9 are connected to a yoke 7, which forms a magnetic path in cooperation with the magnetostrictive bars 1 and 2. The magnetic field H generated by the permanent magnets 8 and 9 circulates along this magnetic path.

In the power generating device 20, as in the example of FIG. 3, when the vibrating body 13 vibrates, the magnetostrictive bars 1 and 2 expand and contract, and the magnetic flux penetrating each of the coils 3 and 4 thereby changes with time, so that induced electromotive force is produced in the coils 3 and 4.

Figure 8:
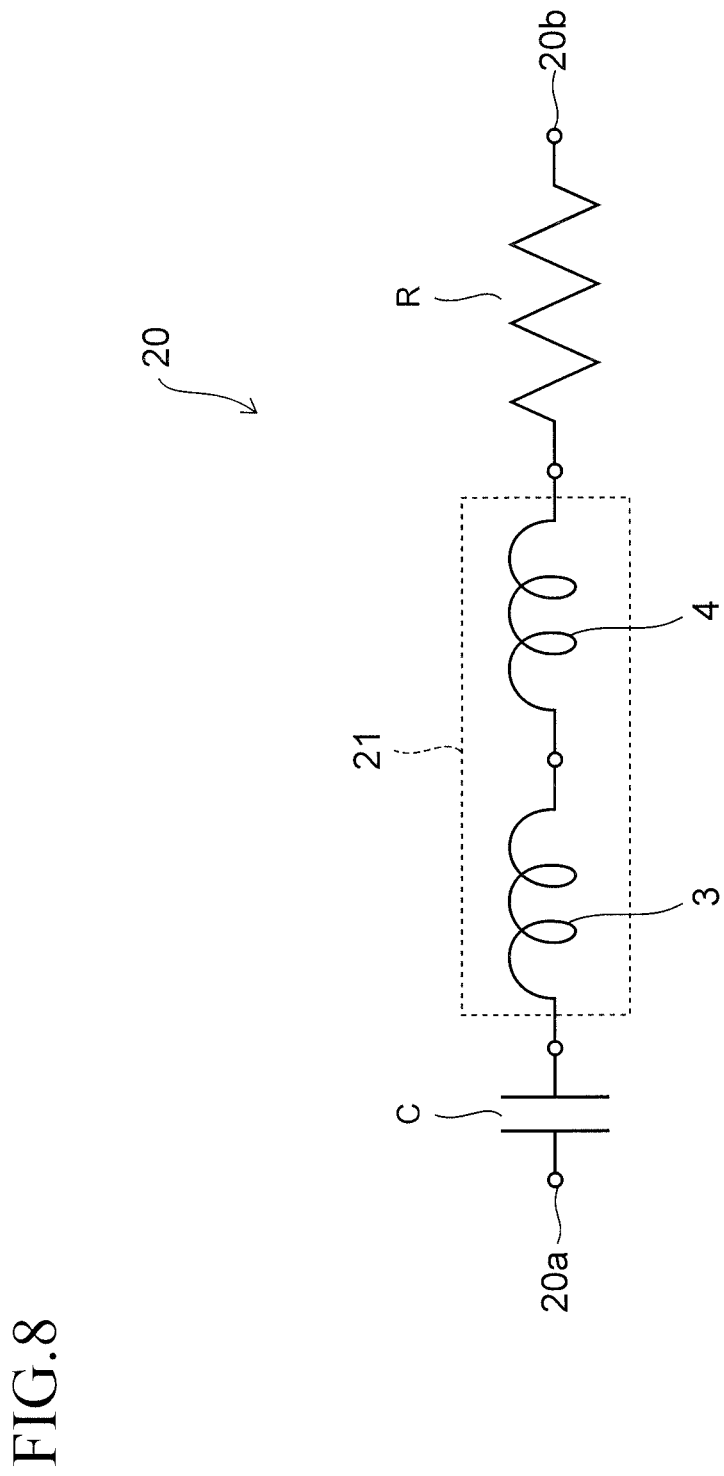
FIG. 8 is an equivalent circuit diagram of the power generating device according to the first embodiment.

FIG. 8 is an equivalent circuit diagram of the power generating device 20.

As illustrated in FIG. 8, in the present embodiment, the first and second coils 3 and 4 are connected in series and constitute a coil group 21. The coil group 21 is connected to a capacitor C and a resistor R in series. Note that the resistance value of the resistor R includes values of internal resistances of the coils 3 and 4.

In the power generating device 20, the portions where the capacitor C and resistor R are provided are not particularly limited. The capacitor C and resistor R may be provided at the arbitrary portions of the power generating device 20. This is also the case for the embodiments described later.

The power generating device 20 includes output terminals 20a and 20b, and the induced electromotive force produced in the first and second coils 3 and 4 is extracted through the terminals 20a and 20b.

Figure 9:
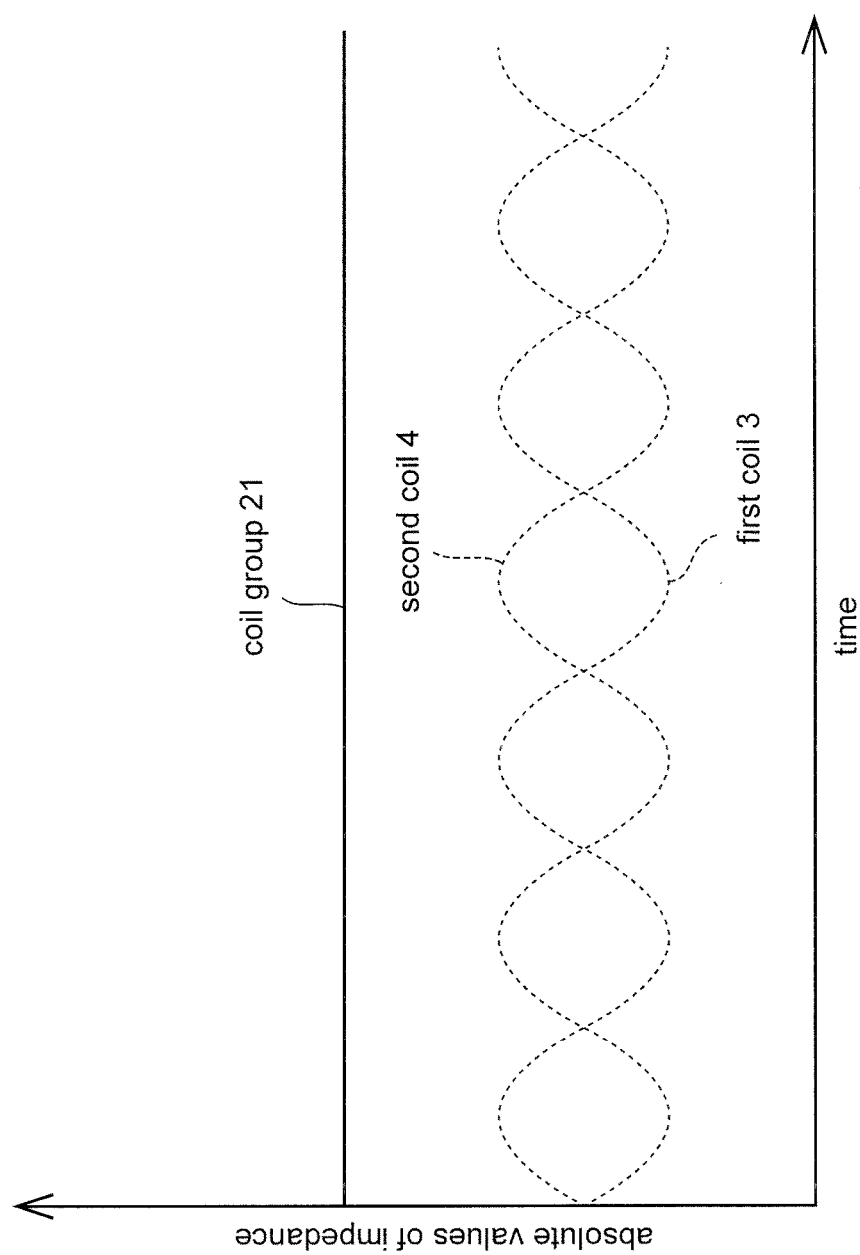
FIG. 9 is a graph schematically illustrating a temporal change in combined impedance of a coil group of the power generating device according to the first embodiment.

FIG. 9 is a graph schematically illustrating temporal change in combined impedance of the coil group 21, and the horizontal axis represents time while the vertical axis represents absolute values of the combined impedance.

Note that FIG. 9 also illustrates impedances of the first and second coils 3 and 4.

The combined impedance of the coil group 21 is the sum of the impedances of the coils 3 and 4. However, as described with reference to FIG. 4, temporal changes in impedance of the first and second coils 3 and 4 have opposite phases. Therefore, the combined impedance of the coil group 21 is constant in time.

As such, once the impedance matching between the power generating device 20 and another circuit is achieved at a certain time, impedance matching can be kept achieved in the subsequent arbitrary time, thereby always enabling efficient transmission of electric power from the power generating device 20 to another circuit.

Figure 10:
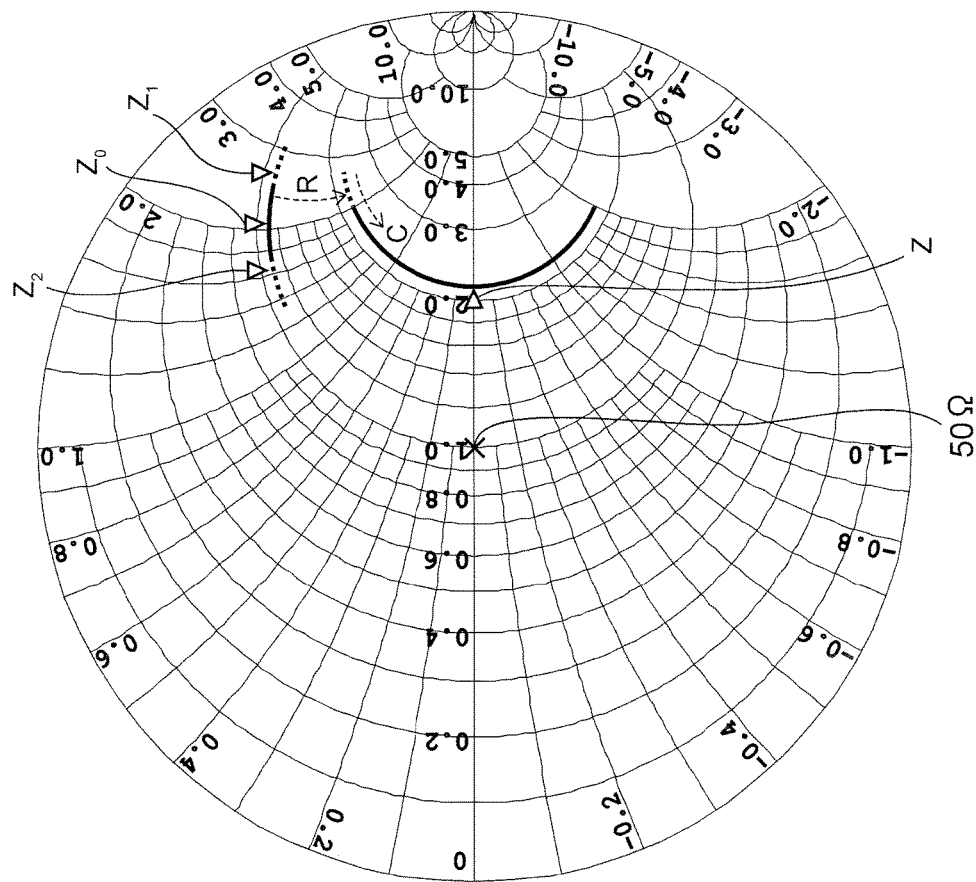
FIG. 10 is a Smith chart illustrating combined impedance of the power generating device according to the first embodiment.

FIG. 10 is a Smith chart illustrating a combined impedance Z of the power generating device 20.

In this example, it is assumed that a downward force of 1.2 kgf is applied to the second joint member 6 of the power generating device 20, and the frequency of the electromotive force induced in the coil 3 and 4 is assumed to range from 80 Hz to 120 Hz.

Note that FIG. 10 also illustrates the impedances $Z_0$, $Z_1$, and $Z_2$ of FIG. 5. As described with reference to FIG. 5, the impedance $Z_0$ is the impedance of each of the coils 3 and 4 when the magnetostrictive bars 1 and 2 are not expanding and contracting. The impedances $Z_1$ and $Z_2$ are impedances of the coils 3 and 4 respectively when the magnetostrictive bars 1 and 2 are expanding and contracting.

As illustrated in FIG. 10, since the resistance R is added to the coil group 21 as described above, the combined impedance Z of the power generating device 20 of the present embodiment is located on a constant-resistance circle of higher resistance than that of the aforementioned impedances $Z_0$, $Z_1$, and $Z_2$.

Moreover, because of the capacitor C added to the coil group 21, the combined impedance Z moves toward the real axis along the constant-resistance circle. Impedance matching with external circuits is often performed on the real axis. Accordingly, when the combined impedance Z becomes close to the real axis as in the above, the impedance matching between the power generating device 20 and another circuit is easily achieved.

Note that the possible values of the combined impedance Z is seen like an arc on the constant resistance circle. This is because the combined impedance Z has different values depending on the frequency of the electromotive force induced by the coil group 21. This is also the case for the second embodiment described later.

Moreover, the combined impedance Z may be located on the real axis by adjusting the capacitance value of the capacitor C in the following manner so that the reactance component of the combined impedance Z is 0.

Since the equivalent circuit of FIG. 8 is a series RLC circuit, the combined impedance z of the power generating device 20 is expressed by the following equation (1):

$$Z = R + j\omega L + \frac{1}{j\omega C}$$

$$= R + j\omega L - j\frac{1}{\omega C}$$

$$= R + j\left(\omega L - \frac{1}{\omega C}\right). \quad (1)$$

In the equation (1), the resistance value of the resistor R and the capacitance value of the capacitor C are indicated by the same letters R and C as those of the resistor R and capacitor C, respectively. Moreover, L is the combined inductance of the first and second coils 3 and 4, and ω is an angular frequency of vibration of the magnetostrictive bars 1 and 2.

In order to make the reactance component of the combined impedance to 0, the imaginary part of the second term in the right-hand side of the equation (1) needs to be 0. Therefore, the reactance component of the combined impedance Z can be adjusted to 0 by controlling the capacitance of the capacitor C so as to satisfy ωL=1/(ωC).

Accordingly, it is possible to easily achieve impedance matching between the power generating device 20 and another circuit, which is often performed on the real axis.

Moreover, impedance matching is often performed at the point of 50Ω on the real axis as described above. When the reactance component of the combined impedance Z is 0, the combined impedance Z moves leftward on the real axis as the resistance R decreases, and the combined impedance z moves rightward on the real axis as the resistance R increases.

Therefore, the combined impedance Z can be located at the point of 50Ω on the real axis by properly adjusting the resistance value of the resistor R.

According to the present embodiment described above, the first and second coils 3 and 4 are connected in series as illustrated in FIG. 8. Therefore, the temporal changes in the impedances of the coils 3 and 4 can be canceled each other, so that the combined impedance of the power generating device 20 can be made constant in time.

Moreover, since the capacitor C is connected to the coil group 21 composed of the coils 3 and 4 in series, the reactance component of the combined impedance of the power generating device 20 can be set to 0, so that impedance matching between the power generating device 20 and another circuit can be achieved on the real axis.

Furthermore, by controlling the resistance value of the resistor R added to the coil group 21, it is possible to achieve impedance matching at the point of 50Ω on the real axis.

Second Embodiment

Figure 11:
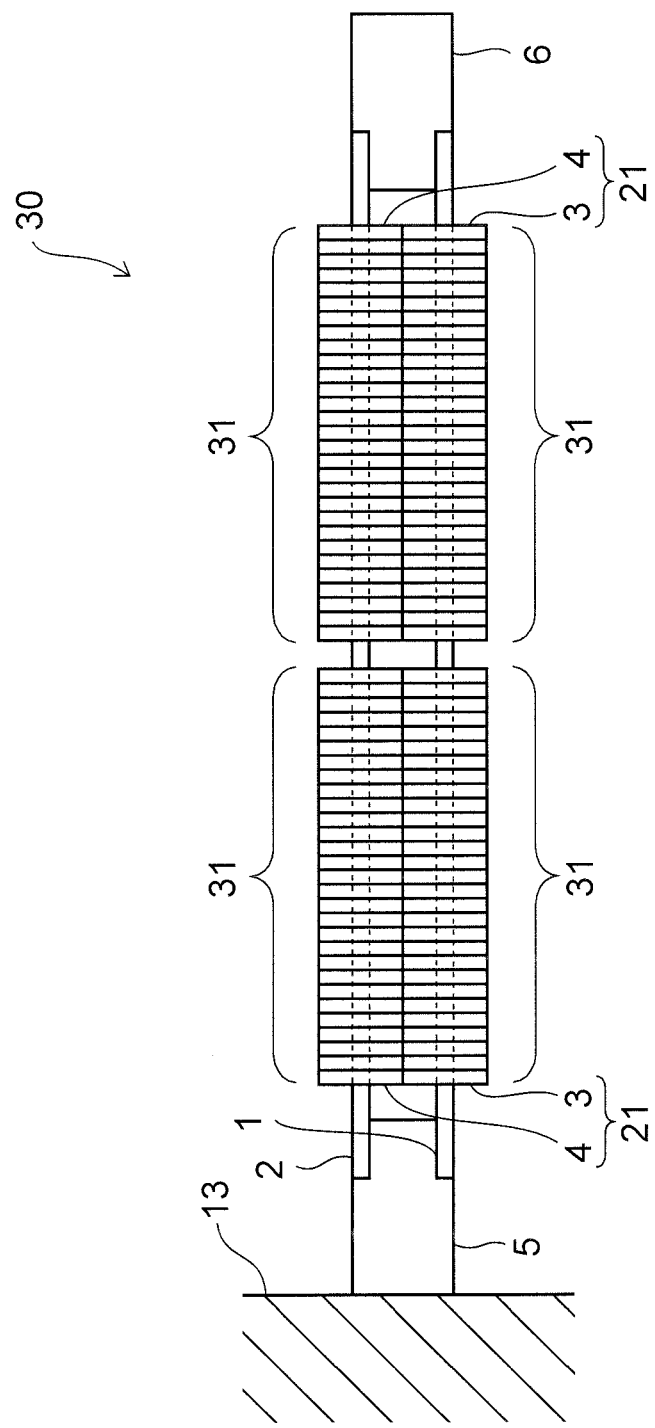
FIG. 11 is a front view of a power generating device according to a second embodiment.

FIG. 11 is a front view of a power generating device according to a second embodiment. Note that the same components in FIG. 11 as those described in the first embodiment are given the same reference numerals as those of the first embodiment, and the description thereof is omitted.

As illustrated in FIG. 11, a power generating device 30 includes a plurality of small regions 31 in each of first and second magnetostrictive bars 1 and 2. Each of the small regions 31 are separated in the axis direction of the first and second magnetostrictive bars 1 and 2.

In each of the small regions 31, one of the coils 3 and 4 is provided. Thus, the first magnetostrictive bar 1 is provided with the plural first coils 3, while the second magnetostrictive bar 2 is provided with plural second coils 4.

Moreover, the coil group 21 is formed by connecting one first coil 3 and one second coil 4 in series. In the present embodiment, a plurality of coil group 21 is provided.

Figure 12:
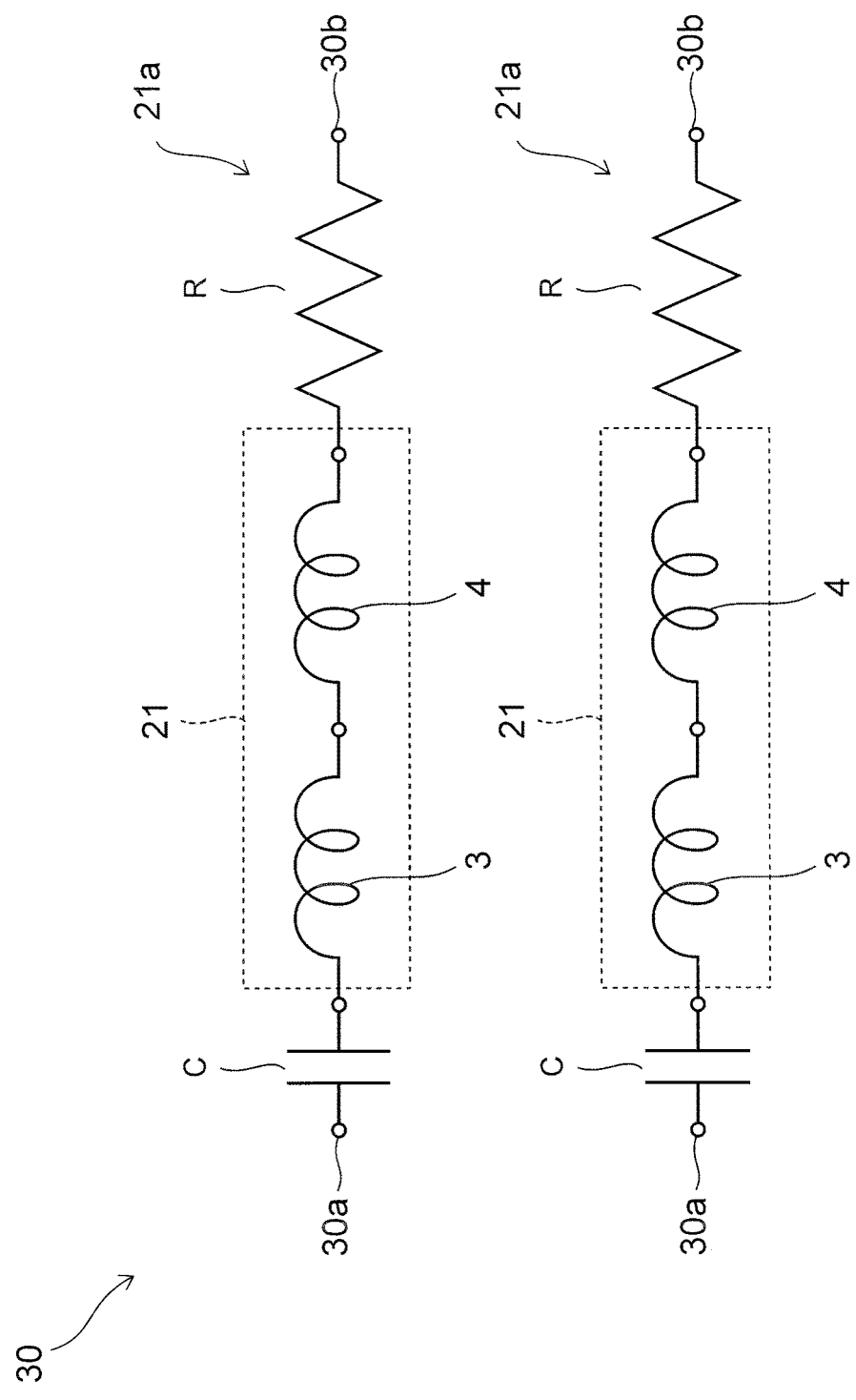
FIG. 12 is an equivalent circuit diagram of the power generating device according to the second embodiment.

FIG. 12 is an equivalent circuit diagram of the power generating device 30 according to the second embodiment.

As illustrated in FIG. 12, in the power generating device 30, each of the plural coil groups 21 is provided with output terminals 30a and 30b. The induced electromotive force of each coil group 21 is extracted through the output terminals 30a and 30b.

By providing the plural coil groups 21 in this manner, it is possible to obtain as many independent power supplies 21a as the number of the coil groups 21.

Moreover, in order to adjust the combined impedance of each power supply 21a, each coil group 21 is connected to a capacitor C and a resistor R in series as in the first embodiment. Note that the resistance R includes internal resistance of the corresponding coil group 21 as described in the first embodiment.

Figure 13:
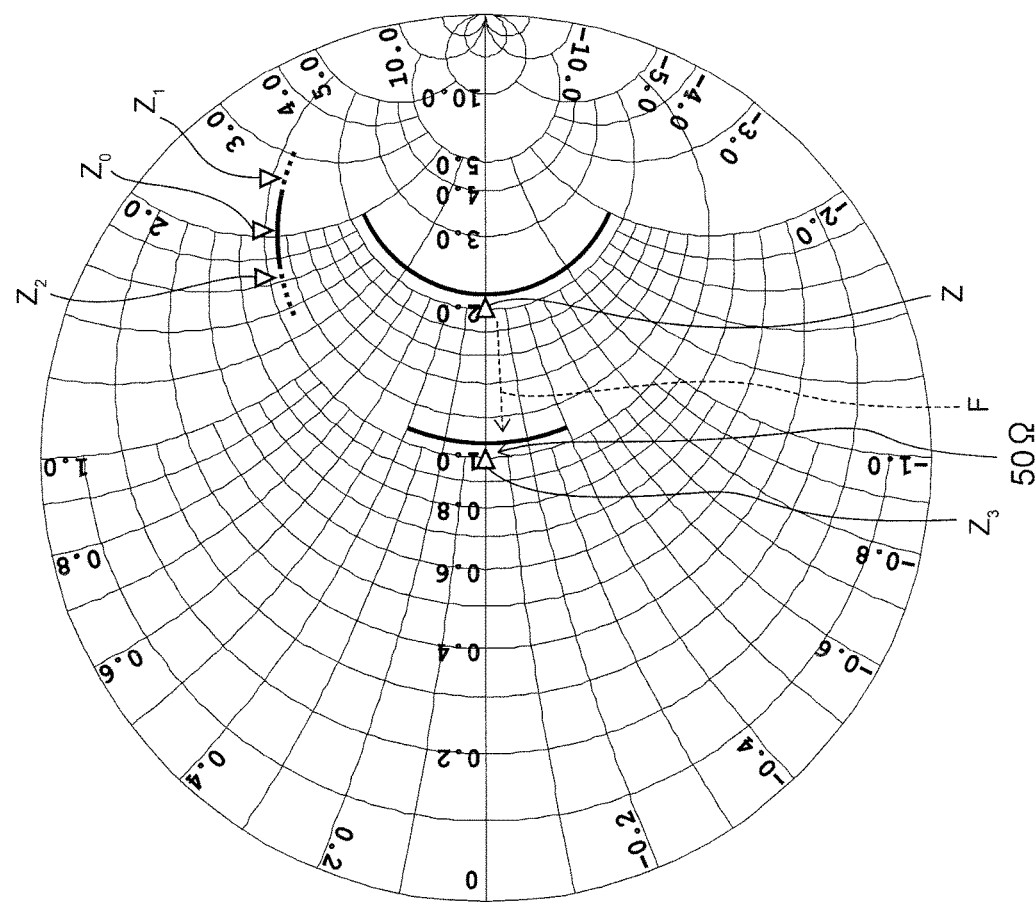
FIG. 13 is a Smith chart illustrating combined impedance of a power supply of the power generating device according to the second embodiment.

FIG. 13 is a Smith chart illustrating combined impedance $Z_3$ of one of the power supplies 21a.

In this example, it is assumed that a downward force of 1.2 kgf is applied to the second joint member 6 of the power generating device 30, and the frequency of the electromotive force induced by each of the coils 3 and 4 is assumed to range from 80 Hz to 120 Hz.

FIG. 13 also illustrates the impedances $Z_0$, $Z_1$, and $Z_2$ of FIG. 5.

In the present embodiment, each of the magnetostrictive bars 1 and 2 is divided into the small regions 31 as described above. Accordingly, the coils 3 and 4 provided for each small region 31 have lengths shorter than those in the first embodiment, and hence the resistances of the coils 3 and 4 are reduced.

Accordingly, as indicated by an arrow F in FIG. 13, the combined impedance $Z_3$ of the power supply 21a moves more leftward on the real axis than in the first embodiment, so that the impedance $Z_3$ can be easily brought close to 50Ω.

In such a manner, according to the present embodiment, since the internal resistances of the coils 3 and 4 are reduced, the combined impedance Z of the power supply 21a can be easily adjusted to 50Ω.

Third Embodiment

In the second embodiment, the power supplies 21a are individually used as an independent power supply as illustrated in FIG. 12. In the present embodiment, these power supplies 21a are used in combination.

Figure 14:
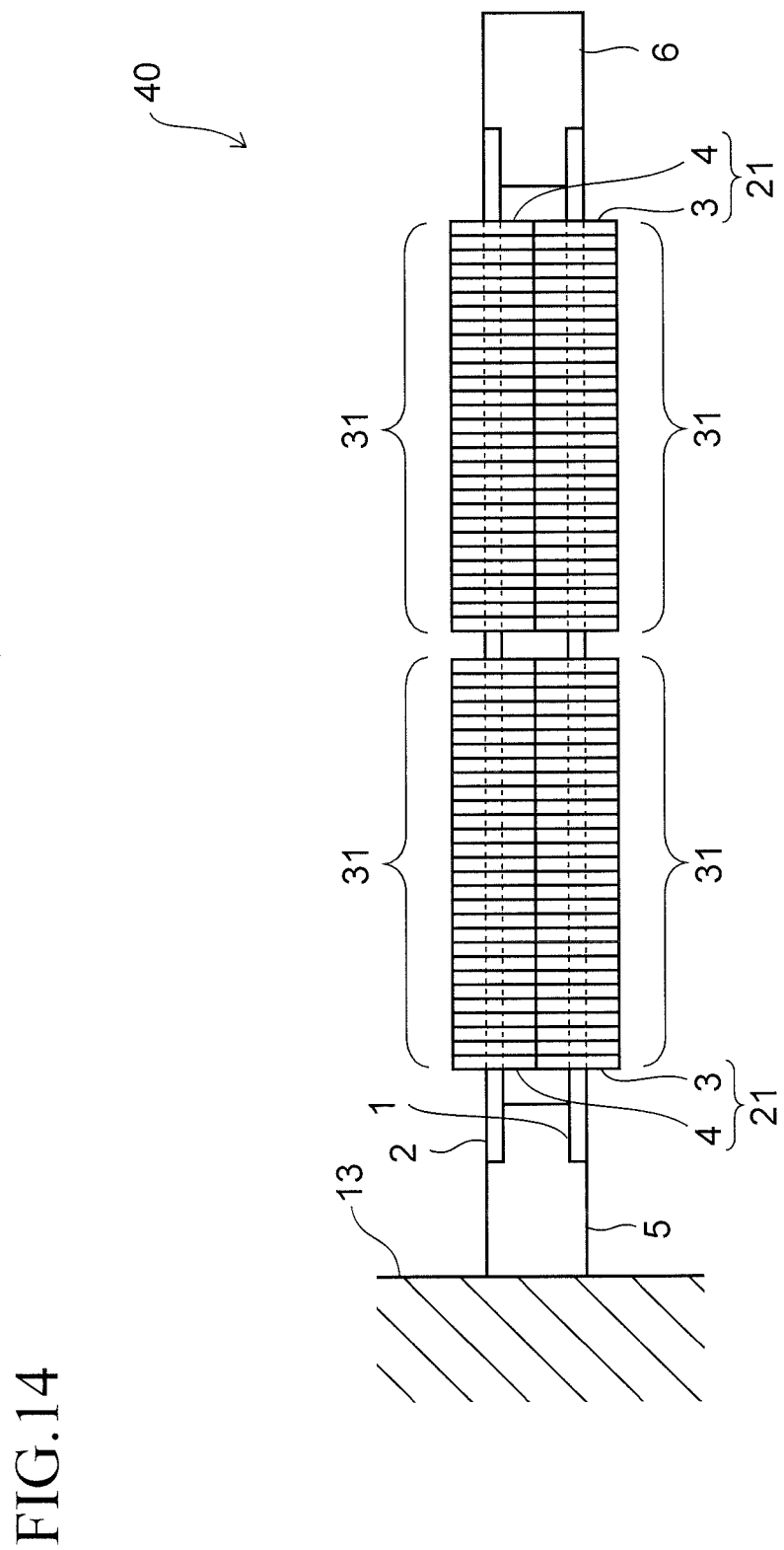
FIG. 14 is a front view of a power generating device according to a third embodiment.

FIG. 14 is a front view of a power generating device according to the present embodiment. The same components in FIG. 14 as those described in the first and second embodiment are given the same reference numerals as those of these embodiments, and the description thereof is omitted.

As illustrated in FIG. 14, in a power generating device 40 according to the present embodiment, a plurality of first coils 3 is provided for a first magnetostrictive bar 1, and a plurality of second coils 4 is provided for a second magnetostrictive bar 2, as in the second embodiment.

Moreover, coil group 21 is constructed from one first coil 3 and one second coil 4 which are connected in series.

Figure 15:
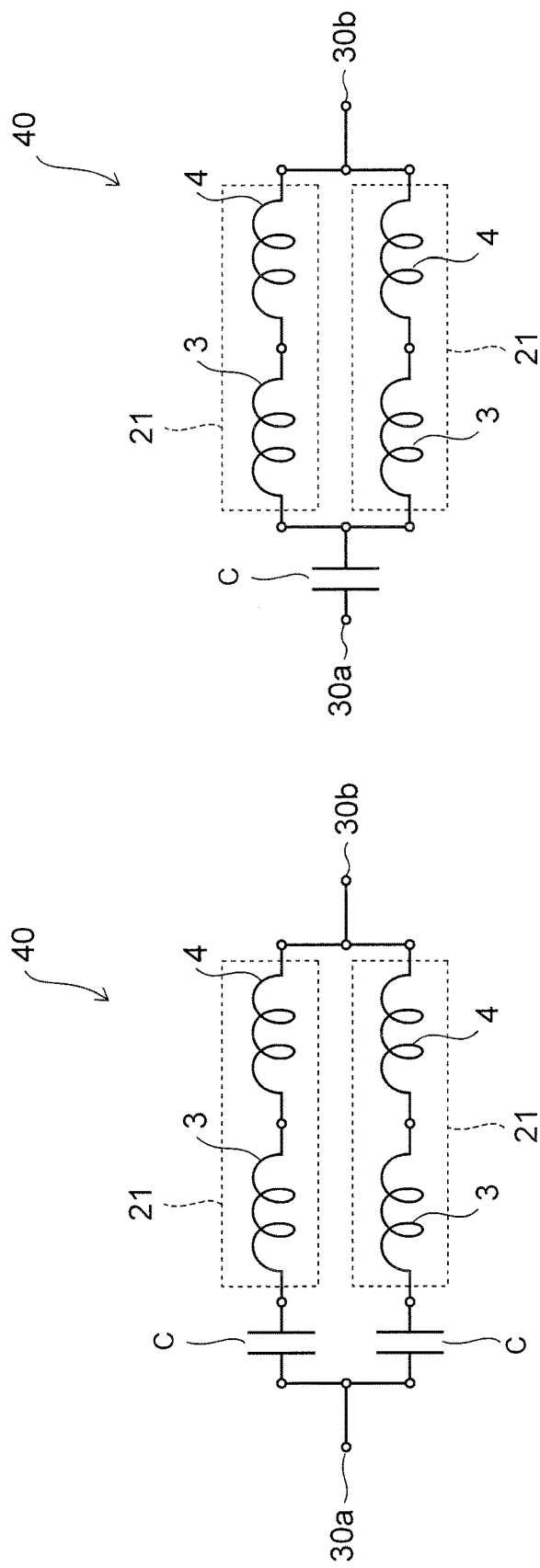
FIGS. 15A and 15B are equivalent circuit diagrams of the power generating device according to the third embodiment.

FIGS. 15A and 15B are equivalent circuit diagrams of the power generating device 40. Note that the same components in FIGS. 15A and 15B as those described in FIG. 12 are given the same reference numerals as those in FIG. 12, and the description thereof is omitted.

In each example of FIGS. 15A and 15B, the plural coil groups 21 are connected in parallel. Note that a plurality of capacitors C for adjusting the impedance is provided corresponding to each coil groups 21 in FIG. 15A, whereas only the single capacitor C is provided in FIG. 15B.

Any one of constitutions of FIGS. 15A and 15B can be selected, based on the specifications of the power generating device 40 and the like.

By connecting the coil groups 21 in parallel in this manner, the resistance of the power generating device 40 is reduced compared with the case where the coil groups 21 are used independently. Therefore, as in the example of FIG. 13, the combined impedance $Z_3$ of the power generating device 40 moves leftward on the real axis, so that the combined impedance $Z_3$ can be easily adjusted to 50Ω.

Moreover, by adjusting the length of the coils 3 and 4 to control the internal resistances of the coils 3 and 4, the combined impedance of the power generating device 40 can be easily adjusted along the real axis.

Fourth Embodiment

In the first to third embodiments, the first coil 3 and second coil 4 in a generating device are connected in series.

On the other hand, in the present embodiment, a plurality of the power generating elements are used in the following manner, and the coils of each of the power generating elements are connected in series.

Figure 16:
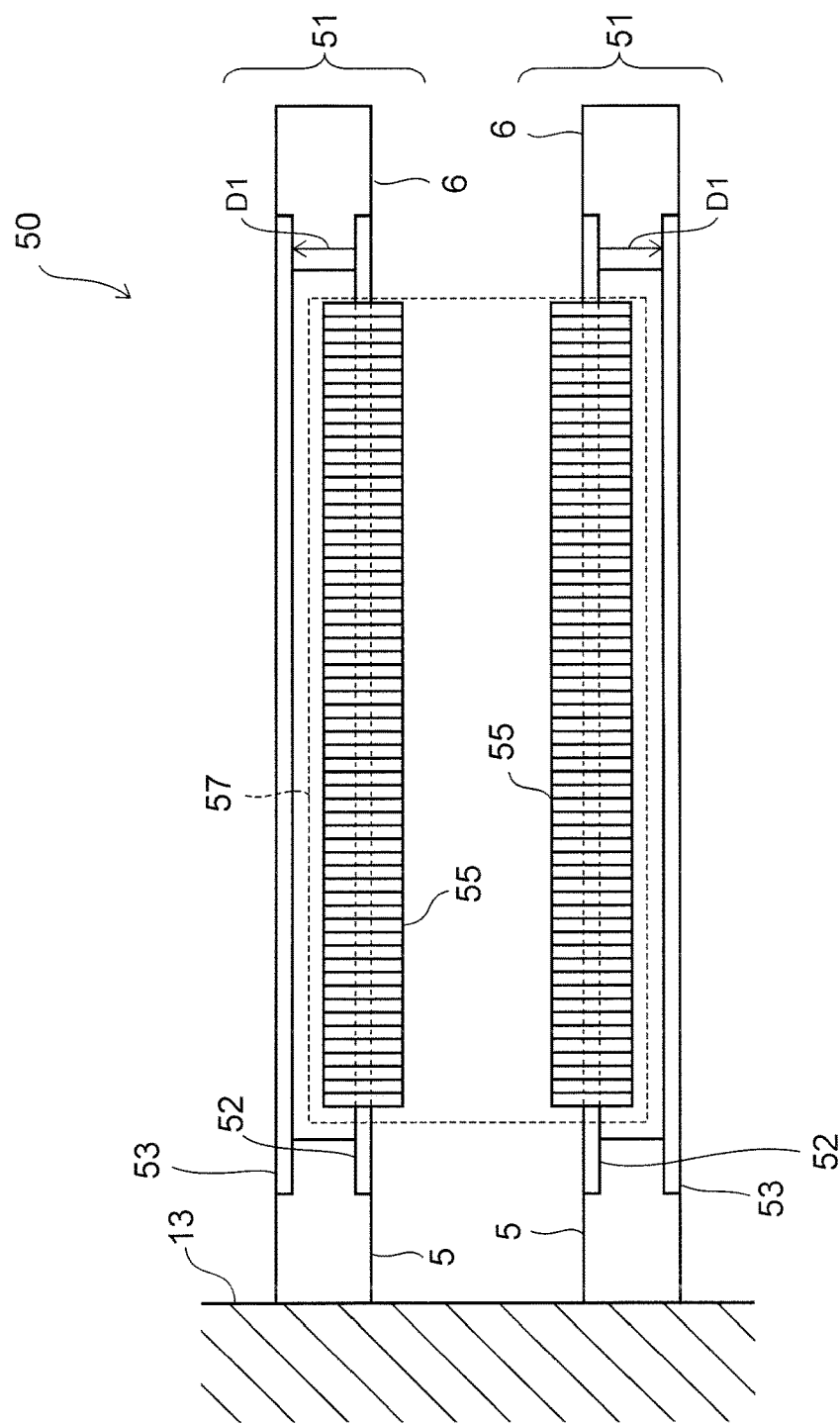
FIG. 16 is a front view of a power generating device according to a fourth embodiment.

FIG. 16 is a front view of a power generating device according to the present embodiment.

The power generating device 50 includes two power generating elements 51.

The power generating elements 51 are fixed to a vibrating body 13 such as a bridge. Each power generating element 51 includes a first bar 52 made of a magnetostrictive material and a second bar 53 extending alongside the first bar 52.

Note that the second bar 53 is disposed away from the first bar 52 in a direction D1. The first directions D1 in the two power generating elements 51 are opposite to each other.

One ends of the first and second bars 52 and 53 are coupled to each other with a first joint member 5, while the other ends of the first and second bars 52 and 53 are coupled to each other with a second joint member 6. As in the first to third embodiments, the joint members 5 and 6 are made of a magnetic material including iron and are connected to the bars 52 and 53 mechanically and magnetically.

Note that the material of the second bar 53 does not need to be a magnetostrictive material and may be a magnetic material such as iron.

Moreover, coils 55 such as a copper wire or the like are wound around the respective first bars 52. The coils 55 of the plural power generating elements 51 are connected to each other in series to constitute a coil group 57.

Figure 17:
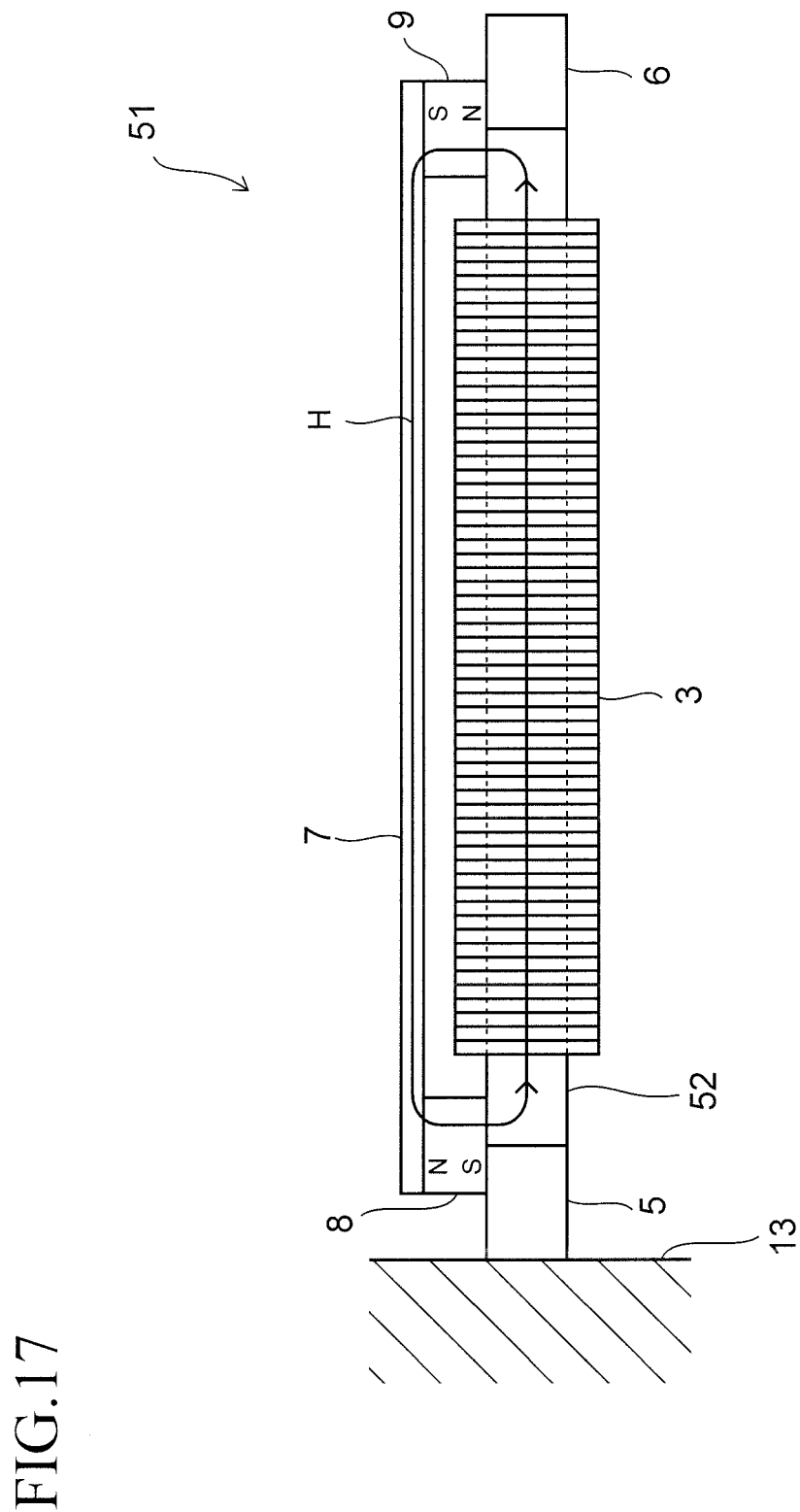
FIG. 17 is a side view of one of power generating elements included in the power generating device according to the fourth embodiment.

FIG. 17 is a side view of the power generating device 51.

Note that the same components described in FIG. 17 as those described in the first to third embodiments are given the same reference numerals as these embodiments, and the description thereof is omitted.

As illustrated in FIG. 17, first and second permanent magnets 8 and 9 are mechanically and magnetically connected to both ends of the first bar 52, respectively.

Moreover, a yoke 7 is provided beside the first bar 52. The yoke 7 extends alongside the first bar 52, and is magnetically and mechanically connected to the permanent magnets 8 and 9. The material of the yoke 7 is a magnetic material including iron, for example.

In this power generating element 51, the bars 52 and 53 and yoke 7 form a magnetic path, and the magnetic field H generated by the permanent magnets 8 and 9 circulates along the magnetic path.

Figure 18:
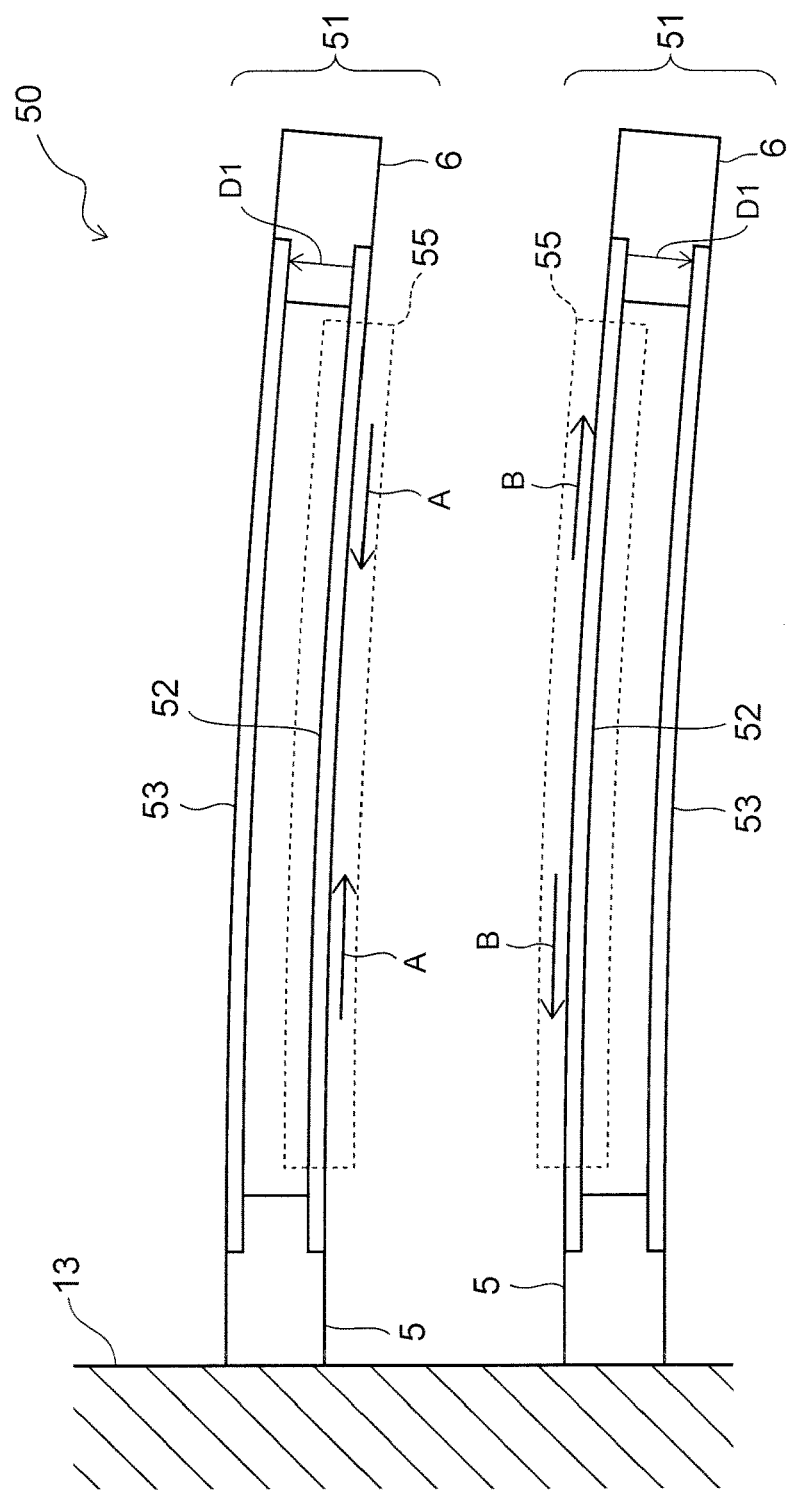
FIG. 18 is a schematic diagram for explaining the principle of power generation by the power generating device according to the fourth embodiment.

FIG. 18 is a schematic diagram for explaining the principle of power generation by the power generating device 50. Note that in FIG. 18, the same components as those described in FIGS. 16 and 17 are given the same reference numerals as in the FIGS. 16 and 17, and the description thereof is omitted.

In FIG. 18, the coils 55 are not illustrated in order to facilitate the visualization.

As illustrated in FIG. 18, when the vibrating body 13 vibrates, the first and second bars 52 and 53 in each of the two power generating elements 51 vibrate, which causes expansion and contraction of these bars 52 and 53. Thus, the magnetic flux penetrating the coil 55 wound around each first bar 52 changes in time, so that the induced electromotive force is produced in the coil 55.

Here, when each of the power generating elements 51 vibrate in a substantially identical phase by the vibration of the vibrating body 13, the first bar 52 in one of the power generating elements 51 contracts in the direction of arrow A, while the first bar 52 in the other power generating element 51 expands in the direction of arrow B. This is because the first directions D1 of the power generating elements 51 are opposite to each other as described above. Thus, the first bars 52 in the two power generating elements 51 expand and contract in the opposite phases to each other.

Figure 19:
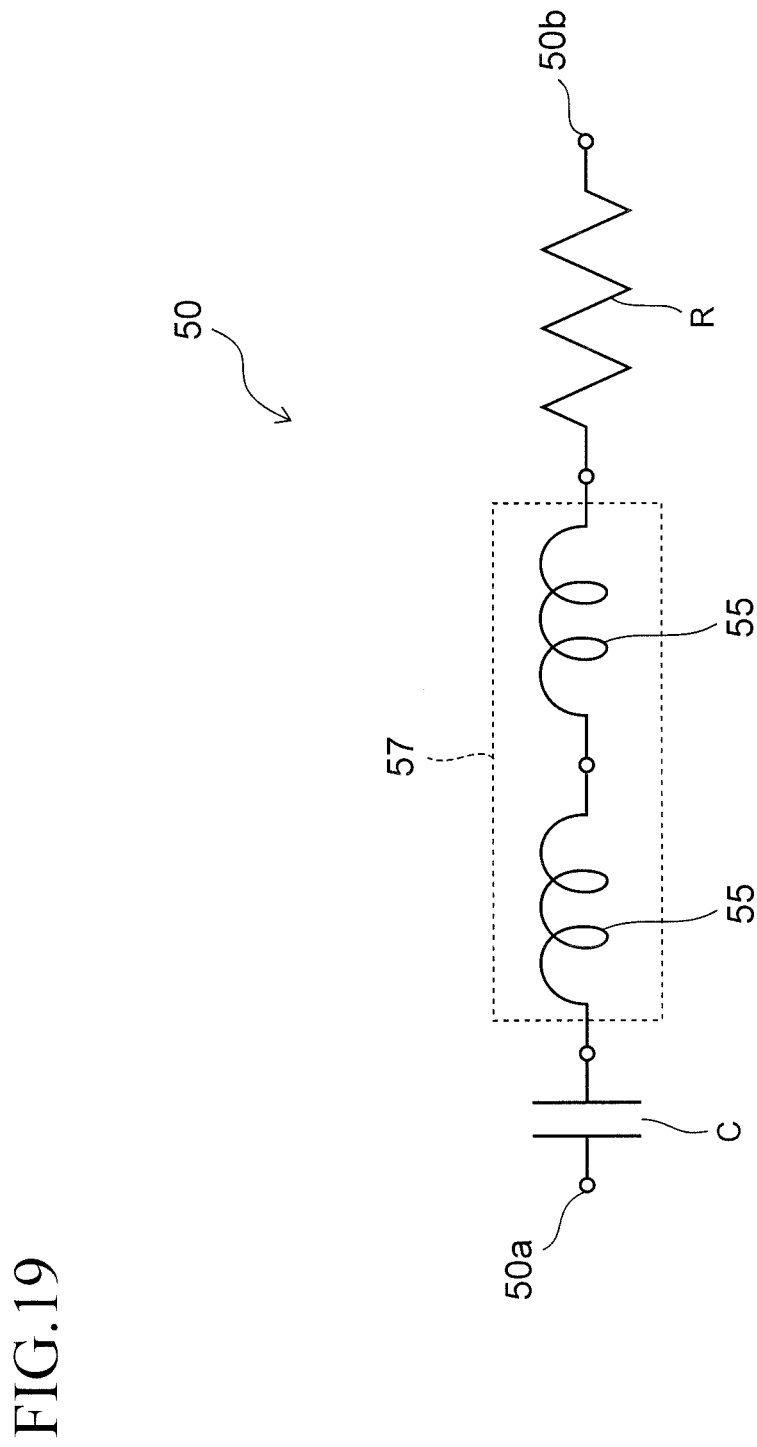
FIG. 19 is an equivalent circuit diagram of the power generating device according to the fourth embodiment.

FIG. 19 is an equivalent circuit diagram of the power generating device 50.

As illustrated in FIG. 19, the coils 55 of the power generating devices 51 are connected in series as described above, and the coils 55 constitute a coil group 57.

Moreover, the coil group 57 is connected in series to a capacitor C and a resistance R for adjusting the impedance of the power generating device 50. Note that the resistance value of the resistance R includes the internal resistance value of the coils 55.

Moreover, the power generating device 50 is provided with output terminals 50a and 50b. The induced electromotive force produced in the coil group 57 is extracted through the terminals 50a and 50b.

Figure 20:
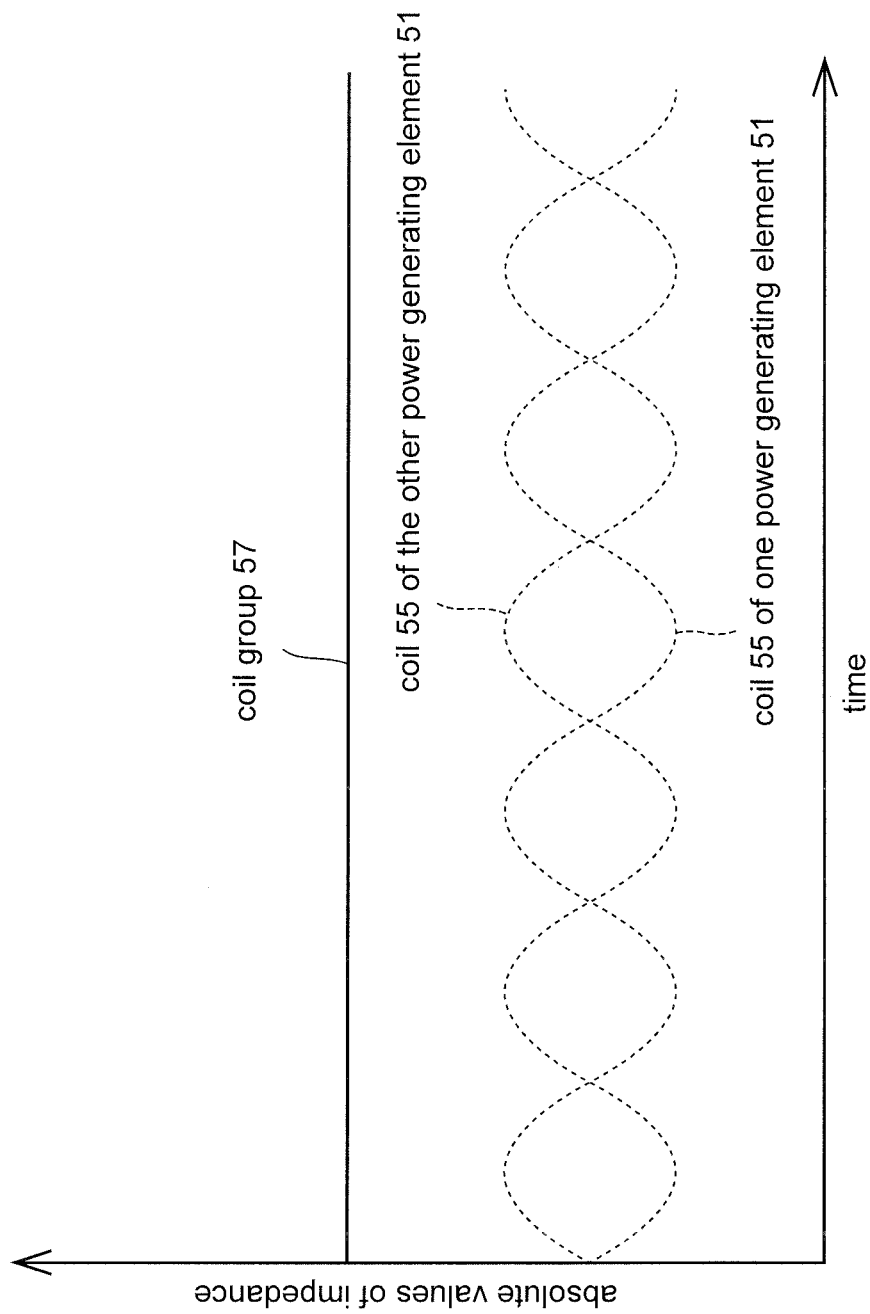
FIG. 20 is a graph schematically illustrating temporal change in combined impedance of a coil group of the power generating device according to the fourth embodiment.

FIG. 20 is a graph schematically illustrating temporal change in the combined impedance of the coil group 57. The horizontal axis of the graph represents time, while the vertical axis represents absolute values of the combined impedance.

FIG. 20 also illustrates impedances of the coils 55 of the two power generating elements 51.

As described above, the directions in which the first bars 51 expand and contract is opposite in the two power generating elements 51. Accordingly, the temporal changes in impedance of the coils 55 becomes opposite phases in the two power generating elements 51.

As the result, the combined impedance of the coil group 57, which is represented by the sum of impedances of the coils 55, becomes constant in time.

In the present embodiment, as in the first to third embodiments, the combined impedance of the power generating device 50 is constant in time, so that impedance matching between the power generating device 50 and another circuit can be achieved.

Moreover, by connecting the capacitor C and resistor R for impedance adjustment to the coil group 57 as illustrated in FIG. 19, impedance matching between the power generating device 50 and another circuit can be achieved on the real axis because of the same reason as the first embodiment.

Fifth Embodiment

In the present embodiment, a description is given of a sensor system using the power generating device described in the first to fourth embodiments.

Figure 21:
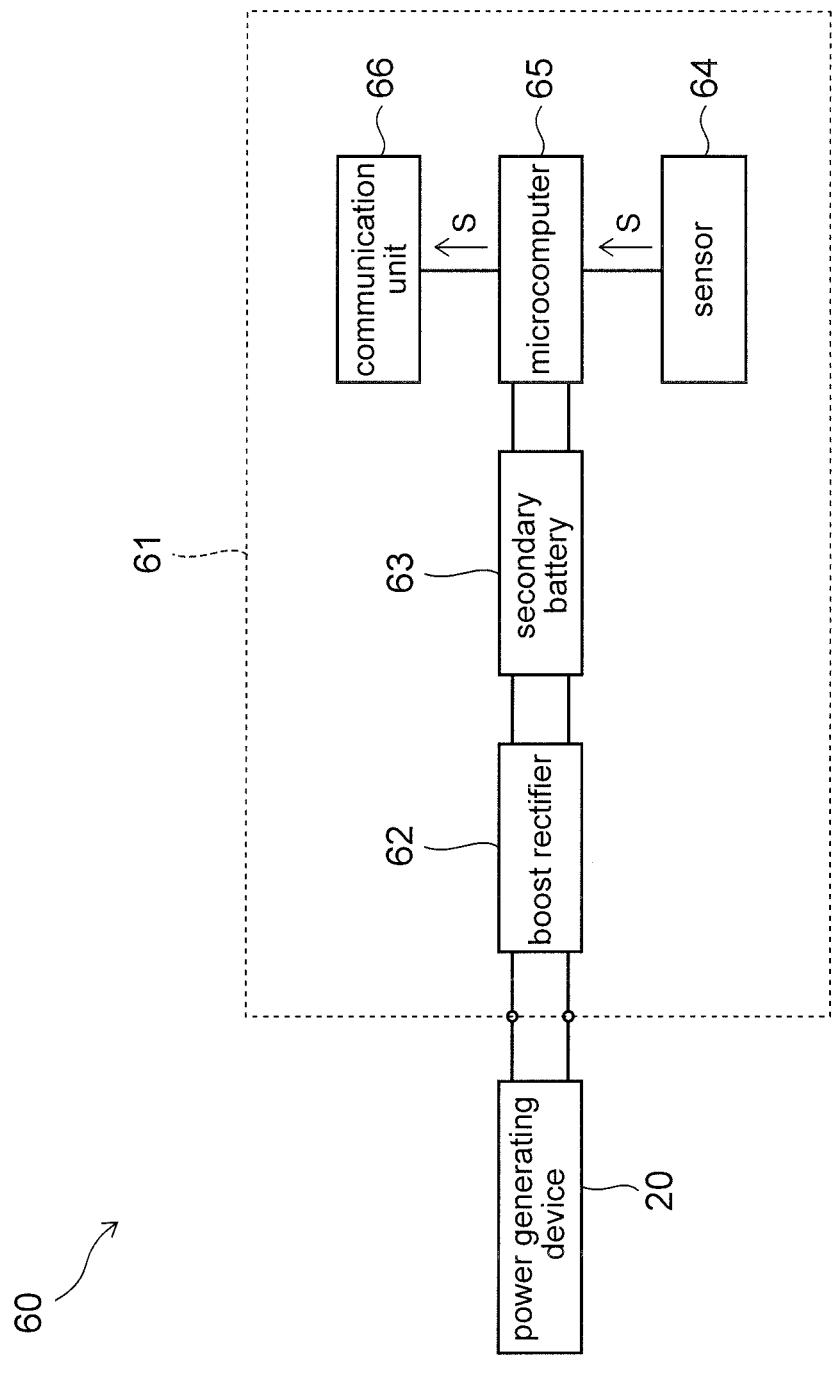
FIG. 21 is a block diagram of a sensor system according to a fifth embodiment.

FIG. 21 is a block diagram of the sensor system according to the present embodiment.

A sensor system 60 monitors a bridge or the like by using electric power obtained by an energy harvesting technique. The sensor system 60 includes the power generating device 20 described in the first embodiment, and a circuit unit 61 supplied with electric power from the power generating device 20.

Note that instead of the power generating device 20, the power generating devices 30, 40, and 50 described in the second to fourth embodiments may be used.

The circuit unit 61 includes a boost rectifier 62, a secondary battery 63, a sensor 64, a microcomputer 65, and a communication unit 66.

The boost rectifier 62 rectifies the output current of the power generating device 20. The boost rectifier 62 boosts the output voltage of the power generating device 20 to a predetermined DC voltage.

The secondary battery 63 is charged with the above DC voltage. Then, the sensor 64, microcomputer 65, and communication unit 66 are driven with the output voltage of the secondary battery 63.

The sensor 64 is an acceleration sensor to detect vibration of a bridge, a tunnel, and the like, for example. The sensor 64 sends a sensor signal S including the magnitude and cycle of the vibration to the microcomputer 65. Instead of the acceleration sensor, the sensor 64 may be a temperature sensor or a pressure sensor to measure the temperature or pressure of the atmosphere.

The frequency at which the sensor signal S is acquired is controlled by the microcomputer 65. The sensor signal S is acquired at a frequency of once a day, for example.

The microcomputer 65 sends the sensor signal S to the communication unit 66. The communication unit 66 wirelessly transmits the sensor signal S to the outside according to a predetermined wireless protocol.

The sensor signal S wirelessly transmitted is received by a terminal such as a personal computer, for example. By using the terminal, a user can see information of the environment where the sensor 64 is placed.

According to the sensor system 60, as described in the first embodiment, the impedance of the power generating device 20 is constant in time. Therefore, the state where the impedance matching between the power generating device 20 and the circuit unit 61 is achieved can be maintained, thus preventing loss of electric power supplied from the power generating device 20 to the circuit unit 61.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power generating device, comprising:
a first magnetostrictive bar;
a second magnetostrictive bar extending alongside the first magnetostrictive bar;
a joint member coupling the first magnetostrictive bar and the second magnetostrictive bars; and
a coil group including a first coil wound around the first magnetostrictive bar and a second coil wound around the second magnetostrictive bar,
wherein the first coil and the second coil are connected in series, and
when the first and second magnetostrictive bars periodically expand and contract, temporal changes in impedance of the first and second coils, having mutually opposite phases and canceling each other, cause the coil group to have a combined impedance of the first and second coils that is constant in time to enable impedance matching between the power generating device and another circuit.

2. The power generating device according to claim 1, further comprising a capacitor connected to the coil group in series,
wherein a reactance component of combined impedance of the coil group and the capacitor is set to 0.

3. The power generating device according to claim 2, wherein the real part of the combined impedance is 50Ω.

4. The power generating device according to claim 1, wherein a plurality of the coil groups are provided in such a way that a plurality of the first coils are provided to the first magnetostrictive bar, and a plurality of the second coils are provided to the second magnetostrictive bar.

5. The power generating device according to claim 4, wherein the plurality of coil groups are connected in parallel.

6. The power generating device according to claim 1, further comprising:
a permanent magnet connected to the first magnetostrictive bar and the second magnetostrictive bar; and
a yoke connected to the permanent magnet, the yoke extending alongside the first magnetostrictive bar and the second magnetostrictive bar.

7. A power generating device, comprising:
two power generating elements each including:
a first bar made of a magnetostrictive material;
a second bar which extends alongside the first bar and is disposed away from the first bar in a first direction; and
a coil wound around the first bar,
wherein the first directions of the two power generating elements are opposite to each other, and
the power generating device further comprising:
a coil group made by connecting the coils of each of the power generating elements in series, and
when the first and second bars of each of the power generating elements periodically expand and contract, temporal changes in impedance of the coils of each of the power generating elements, having mutually opposite phases and canceling each other, cause the coil group to have a combined impedance of the coils that is constant in time to enable impedance matching between the power generating device and another circuit.

8. A sensor system, comprising:
a circuit unit including a sensor; and
a power generating device supplying electric power to the circuit unit,
wherein the power generating device includes:
a first magnetostrictive bar;
a second magnetostrictive bar extending alongside the first magnetostrictive bar;
a joint member coupling the first magnetostrictive bar and the second magnetostrictive bar; and
a coil group including a first coil wound around the first magnetostrictive bar and a second coil wound around the second magnetostrictive bar,
wherein the first coil and the second coil are connected in series, and
when the first and second magnetostrictive bars periodically expand and contract, temporal changes in impedance of the first and second coils, having mutually opposite phases and canceling each other, cause the coil group to have a combined impedance of the first and second coils that is constant in time to enable impedance matching between the power generating device and another circuit.

9. The sensor system according to claim 8,
wherein the circuit unit includes a communication unit configured to wirelessly transmit a sensor signal outputted from the sensor.

* * * * *